(12) United States Patent
Chan et al.

(10) Patent No.: US 8,993,444 B2
(45) Date of Patent: Mar. 31, 2015

(54) METHOD TO REDUCE DIELECTRIC CONSTANT OF A POROUS LOW-K FILM

(71) Applicant: Applied Materials, Inc., Santa Clara, CA (US)

(72) Inventors: Kelvin Chan, San Ramon, CA (US); Jin Xu, Fremont, CA (US); Kang Sub Yim, Palo Alto, CA (US); Alexandros T. Demos, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/920,380

(22) Filed: Jun. 18, 2013

(65) Prior Publication Data

US 2014/0017895 A1 Jan. 16, 2014

Related U.S. Application Data

(60) Provisional application No. 61/671,191, filed on Jul. 13, 2012.

(51) Int. Cl.
*H01L 21/302* (2006.01)
*H01L 21/3065* (2006.01)
*H01L 21/3105* (2006.01)
(Continued)

(52) U.S. Cl.
CPC ....... *H01L 21/3065* (2013.01); *H01L 21/02126* (2013.01); *H01L 21/02203* (2013.01); *H01L 21/3105* (2013.01); *C23C 16/56* (2013.01); *H01L 21/67115* (2013.01); *H01L 21/6719* (2013.01); *H01L 21/76814* (2013.01); *H01L 21/7682* (2013.01); *H01L 21/76825* (2013.01); *H01L 21/76826* (2013.01); *H01L 2221/1047* (2013.01)
USPC ........... 438/694; 438/689; 438/690; 438/692; 257/E21.471; 257/471; 257/E21.211

(58) Field of Classification Search
USPC ........................ 438/689–694, 778, 784, 789; 257/E21.471, E21.211
See application file for complete search history.

(56) References Cited

U.S. PATENT DOCUMENTS 6,475,930 B1 * 11/2002 Junker et al. ................. 438/787
6,593,251 B2 * 7/2003 Baklanov et al. ............. 438/778
(Continued)

FOREIGN PATENT DOCUMENTS

KR 10-2008-0076847 8/2008

OTHER PUBLICATIONS

International Search Report and Written Opinion of the International Searching Authority mailed Sep. 27, 2013 in PCT/US2013/046285.

*Primary Examiner* — Duy Deo
*Assistant Examiner* — Maki Angadi
(74) *Attorney, Agent, or Firm* — Patterson & Sheridan, LLP

(57) ABSTRACT

Embodiments of the present invention generally relate to methods for lowering the dielectric constant of low-k dielectric films used in semiconductor fabrication. In one embodiment, a method for lowering the dielectric constant (k) of a low-k silicon-containing dielectric film, comprising exposing a porous low-k silicon-containing dielectric film to a hydrofluoric acid solution and subsequently exposing the low-k silicon-containing dielectric film to a silylation agent. The silylation agent reacts with Si—OH functional groups in the porous low-k dielectric film to increase the concentration of carbon in the low-k dielectric film.

20 Claims, 4 Drawing Sheets

(51) Int. Cl.
*C23C 16/56* (2006.01)
*H01L 21/67* (2006.01)
*H01L 21/768* (2006.01)
*H01L 21/02* (2006.01)

(56) References Cited

U.S. PATENT DOCUMENTS

| | | |
|---|---|---|
| 7,482,281 B2 | 1/2009 | Fujii et al. |
| 7,541,200 B1 * | 6/2009 | van Schravendijk et al. ..... 438/4 |
| 7,709,371 B2 * | 5/2010 | Bhanap et al. ................ 438/623 |
| 8,216,861 B1 | 7/2012 | Yim et al. |
| 2006/0251827 A1 | 11/2006 | Nowak et al. |
| 2009/0061633 A1 | 3/2009 | Nakata et al. |
| 2010/0065758 A1 | 3/2010 | Liu et al. |
| 2010/0087062 A1 | 4/2010 | Lakshmanan et al. |
| 2011/0237080 A1 | 9/2011 | Liu et al. |
| 2012/0258259 A1 | 10/2012 | Bansal et al. |
| 2012/0270339 A1 * | 10/2012 | Xie et al. .......................... 438/4 |

* cited by examiner

METHOD TO REDUCE DIELECTRIC CONSTANT OF A POROUS LOW-K FILM

CROSS-REFERENCE TO RELATED APPLICATIONS

This application claims benefit of U.S. provisional patent application Ser. No. 61/671,191, filed Jul. 13, 2012 which is herein incorporated by reference in its entirety.

BACKGROUND

1. Field

Embodiments of the present invention generally relate to methods for lowering the dielectric constant of low-k dielectric films used in semiconductor fabrication.

2. Description of the Related Art

The dielectric constant (k) of dielectric films in semiconductor fabrication is continually decreasing as device scaling continues. Minimizing integration damage on low dielectric constant (low-k) films is important to be able to continue decreasing feature sizes. However, as feature sizes shrink, improvement in the resistive capacitance and reliability of dielectric films becomes a serious challenge.

Porous low-k dielectric films including for example, carbon-doped oxides (CDO), experience damage to their bonding structures when exposed to integration steps such as, but not limited to, polishing, etching, ashing, and cleaning. Dielectric films having a higher k-value may be better able to survive subsequent integration steps; however, a lower k-value is typically desirable in the final film as feature sizes shrink. For example, for a damascene process, a patterned low-k dielectric film is typically filled with copper followed by a chemical mechanical planarization (CMP) process to planarize the copper film. A dielectric film having a higher k-value would be more mechanically robust and better able to survive the CMP process without significant damage. Whereas a dielectric film having a lower dielectric constant would be less mechanically robust and significantly damaged by the CMP process.

Thus, a method for lowering the k-value of dielectric films is necessary to improve efficiency and allow for smaller device sizes.

SUMMARY

Embodiments of the present invention generally relate to methods for lowering the dielectric constant of low-k dielectric films used in semiconductor fabrication. In one embodiment, a method for lowering the dielectric constant (k) of a low-k silicon-containing dielectric film is provided. The method comprises exposing a porous low-k silicon-containing dielectric film to a hydrofluoric acid solution and subsequently exposing the low-k silicon-containing dielectric film to a silylation agent.

In another embodiment, a method for lowering the dielectric constant (k) of a low-k silicon-containing dielectric film is provided. The method comprises exposing a porous low-k silicon-containing dielectric film to a hydrofluoric acid solution, exposing the low-k silicon-containing dielectric film to a vaporized silylation agent, and exposing the low-k dielectric film to an ultraviolet (UV) cure process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1A:
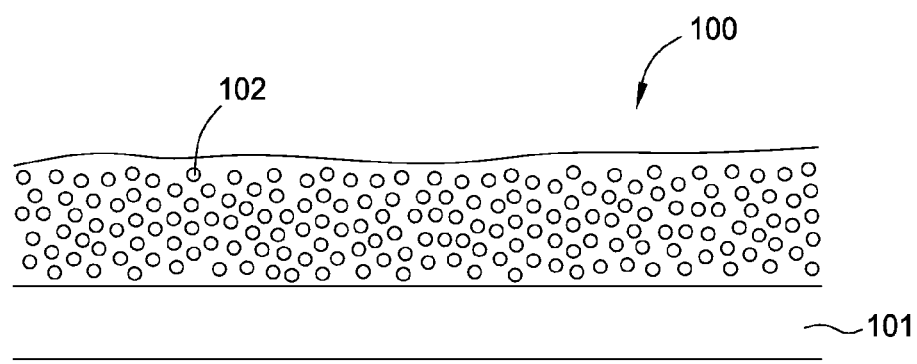
FIGS. 1A-1D illustrate a dielectric film during various stages of processing according to embodiments described herein.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the present invention generally relate to methods for lowering the dielectric constant of low-k dielectric films used in semiconductor fabrication. VLSI/ULSI demands the use of backend dielectrics with increasingly low dielectric constants. One potential application of the embodiments described herein is to allow a dielectric film with a high dielectric constant (i.e., less carbon) to survive certain integration steps and then be processed to have an increased carbon concentration (i.e., lower-k). Fine tuning the carbon content of a porous low-k dielectric film is another potential application.

A substrate containing a porous low-k dielectric film (e.g., CDO) or layers of porous low-k dielectric films is submerged in a hydrogen fluoride (HF) solution. The hydrofluoric acid reacts with the porous low-k dielectric film to yield a higher concentration of Si—OH functional groups in the low-k dielectric film as compared to the low-k dielectric film prior to HF exposure. The substrate may then be rinsed with a rinsing solvent/solution and dried afterwards. After HF exposure, the substrate is then exposed to a silylation agent in the vapor or liquid phase. The silylation agent reacts with Si—OH functional groups in the porous low-k dielectric film to increase the concentration of carbon in the low-k dielectric film. The substrate may be rinsed and dried if necessary. The substrate may be concurrently exposed to both the silylation agent and UV light. The substrate may be exposed to UV light after exposure to the silylation agent. Due to the increased carbon concentration, the dielectric constant of porous low-k dielectric film is lower than it was before HF exposure. Concentration hereby refers to number of moles per unit volume. The HF exposure process may be timed to control the amount of Si—OH functional groups. This control in turn dictates the eventual carbon concentration and therefore the resulting dielectric constant.

FIG. 1A illustrates a dielectric film 100 deposited onto a structure 101. The structure 101 may be a substrate, such as, for example, a silicon wafer, or a previously formed layer, such as, for example, a metallization or interconnect layer. The low-k dielectric film 100 may be any conventional porous, low-k, silicon-based dielectric material having a k-value of about 3 or less. Exemplary low-k dielectric films include, for example, $SiO_2$, SiOC, SiON, SiCOH, SiOCN, and other related films. In one embodiment, the low-k dielectric material is an organosilicate glass (OSG, also known as SiCOH) which is a silicon oxide containing carbon and hydrogen atoms. SiCOH may have a k-value between about 2 and 3 and is available as Black Diamond II™ from Applied Materials of Santa Clara, Calif. The low-k dielectric film 100 may have pores 102 formed therein. The pores may be nanopores. The nanopores may have a diameter in the range from about 0.5 nm to about 20 nm. The low-k dielectric film may be deposited by a plasma-enhanced chemical vapor deposition (PECVD) process or any other suitable deposition technique. The low-k dielectric film 100 may be a porous carbon doped oxide (CDO) film. The low-k dielectric film 100 may have a k-value greater than the k-value of the dielectric film after processing of the film.

Figure 1B:
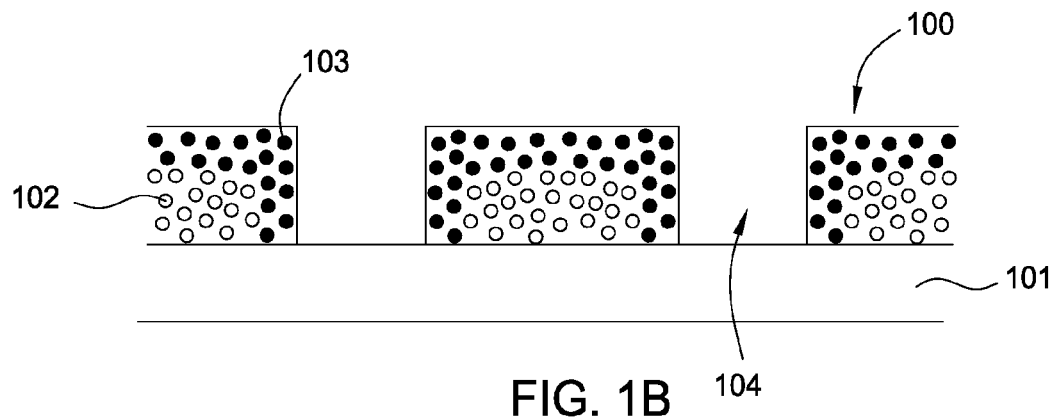

FIG. 1B illustrates the low-k dielectric film 100 after being planarized and etched to form features 104 into the low-k dielectric film 100. The low-k dielectric film 100 may be planarized by a chemical mechanical planarization (CMP) process, for example. The low-k dielectric film 100 may be etched by masking a portion of the low-k dielectric film 100, contacting the unmasked portion of the low-k dielectric film 100 with a plasma formed from hydrofluoric acid (HF) vapor, and ashing away the mask using a plasma formed from oxygen ($O_2$) gas or $CO_2$ gas, for example. The k-value of the low-k dielectric film 100 may be lowered after any of the processing steps using the embodiments described herein.

Figure 1C:
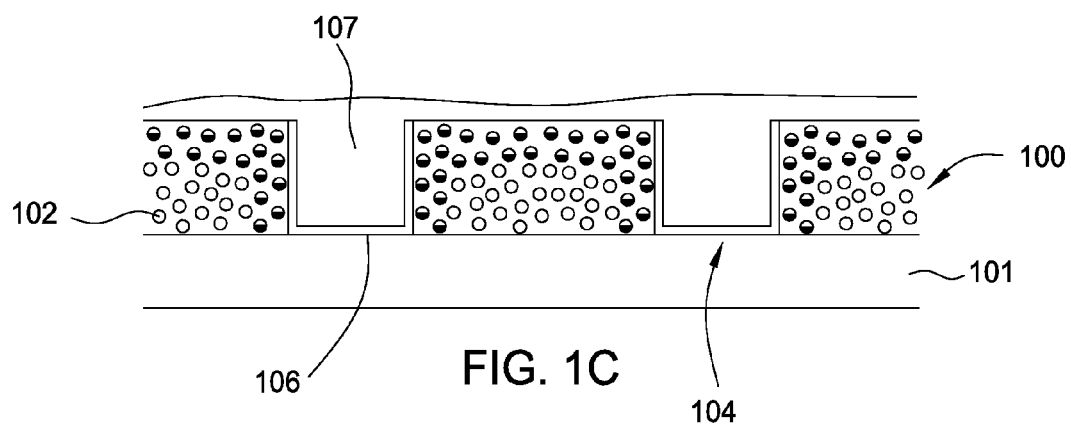
Figure 1D:
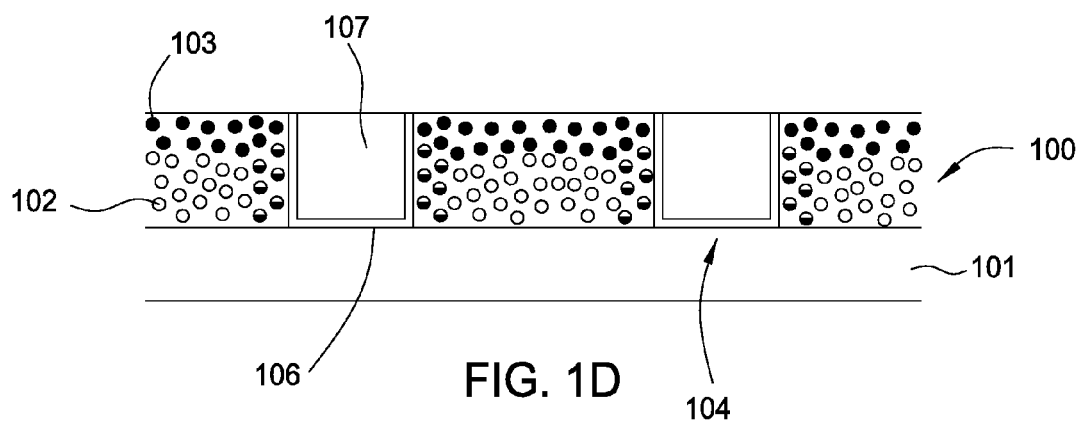

FIG. 1C illustrates the low-k dielectric film 100 after a diffusion barrier 106 may be deposited into the features 104 of the low-k dielectric film 100 and a metal material 107, such as, for example, copper or a copper alloy, may be deposited into the features 104. As illustrated in FIG. 1D, it may be necessary to planarize the metal material 107 and remove any oxides from the metal material 107 that may form during planarization. Common metal oxide removal techniques involve the use of hydrogen or ammonia plasmas. The planarization and/or metal oxide removal processes may damage the surface of the low-k dielectric film 100 if the low-k dielectric film 100 has a lower k-value. As a result, it may be desirable for the low-k dielectric film 100 to have a higher k-value prior to and during processing than the k-value of the dielectric film 100 after the various processing steps are performed. The k-value of the dielectric film 100 may be lowered after any of the aforementioned process steps using the k-value lowering processes described herein.

Figure 2:
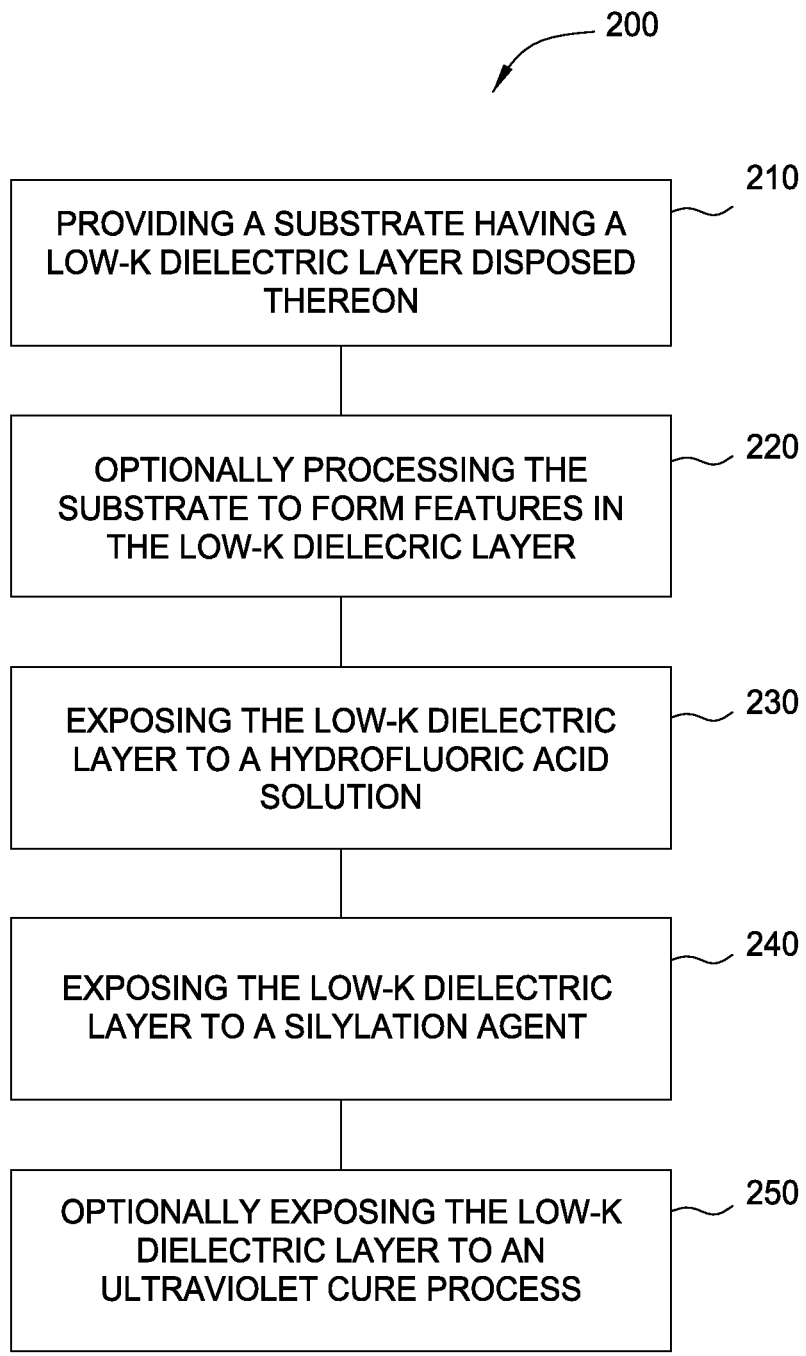
FIG. 2 is a process flow diagram illustrating one method of lowering the k-value of a low-k dielectric film according to embodiments described herein.

FIG. 2 is a process flow diagram illustrating one method 200 of lowering the k-value of a low-k dielectric film according to embodiments described herein. At block 210, a substrate having a low-k dielectric film disposed thereon is positioned in a processing chamber. The substrate and low-k dielectric film may be similar to the low-k dielectric film 100 and structure 101 depicted in FIGS. 1A-1D. The low-k dielectric film typically has an initial k-value which is higher than the final k-value of the film after performance of the method 200. The processing chamber may be similar to the processing chamber 300 depicted in FIG. 3.

At block 220, the substrate may be optionally processed in-situ or in a separate processing chamber to form features, such as vias and/or trenches, in the low-k dielectric film using any suitable dry or wet etching process. Any masking materials and/or residues from the etching process which are left on the substrate may be stripped/removed in-situ or in a dedicated processing chamber using an ashing process or any other suitable technique. Other integration processes that may be used to form the features include planarization processes, diffusion barrier deposition processes, metal deposition processes, and combinations thereof.

At block 230, the low-k dielectric film is exposed to a hydrofluoric acid (HF) solution. The hydrofluoric acid solution may be in liquid or vapor phase. The hydrofluoric acid solution may be a dilute hydrofluoric (DHF) acid solution. The hydrofluoric acid may be buffered, buffered hydrofluoric acid (BHF), or non-buffered. Exemplary buffering agents for buffering HF include ammonium fluoride ($NH_4F$). The hydrofluoric acid solution is chosen because it is believed that the hydrofluoric acid solution will disrupt a portion of the Si—O—Si bonding network in the low-k dielectric film to form Si—OH bonds. The Si—OH bonds in the low-k dielectric film will allow for the insertion of additional carbon into the low-k dielectric film resulting in a reduction of the k-value of the low-k dielectric film. Factors such as the concentration of the dilute hydrofluoric acid solution and the time period of exposure of the low-k dielectric film to the dilute HF will affect the amount of disruption of the Si—O—Si network.

The low-k dielectric film may be dipped in the dilute acid solution for a period of, for example, about 30 seconds to about 800 seconds. In certain embodiments, the dilute acid solution may be sprayed onto the low-k dielectric film. Optionally, following exposure of the low-k dielectric film to the hydrofluoric acid solution, a post-exposure rinse process using for example, DI water, may be used to clean the substrate surface. The optional clean process may be followed by an optional drying process using drying methods known in the art.

The hydrofluoric acid solution may be a dilute solution of hydrofluoric acid (HF) in deionized water. The hydrofluoric acid solution may be from about 0.1% by volume to about 100% by volume hydrofluoric acid. The hydrofluoric acid solution may be from about 1% by volume to about 70% by volume hydrofluoric acid. The hydrofluoric acid solution may include hydrofluoric acid at a concentration of about 0.1% by volume to about 5% by volume, for example, about 0.5% by volume to about 1% by volume. The hydrofluoric acid dip may be performed at room temperature (e.g., about 20° C.). The dipping time may vary depending upon the hydrofluoric acid concentration and the amount of Si—O—Si bond disruption desired.

At block 230, the low-k dielectric film is exposed to a silylation agent. In one embodiment, the silylation process may be performed in a UV based processing chamber, such as the processing chamber 300 discussed with respect to FIG. 3. The silylation process may be used to recover or repair at least some of the damage to the low-k dielectric film caused during block 220 as well as allowing for the insertion of additional carbon into the low-k dielectric film resulting in further reduction of the k-value of the low-k dielectric film. Exposure of the porous low-k dielectric film 100 to the silylation agent may convert the Si—OH groups in the dielectric film 100 into hydrophobic groups, for example, Si—O—Si($CH_3$)$_3$ groups. The hydrophobic groups assist in driving water out of the damaged pores 103 of the dielectric film 100.

Exposure of the low-k dielectric film 100 to the silylation agent may occur in vapor phase or liquid phase. The vapor phase silylation process comprises contacting the low-k dielectric film 100 with a vaporized silylation agent to create the Si—O—Si($CH_3$)$_3$ groups in the low-k dielectric film 100 described above. Vaporizing the silylation agent allows the silylation agent to penetrate deeply into the low-k dielectric film 100. Exemplary silylation agents include hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) ($CH_3$—O—Si—($CH_3$)$_3$), dimethyldimethoxysilane (DMDMS) (($CH_3$)$_2$—Si—($OCH_3$)$_2$), methyltrimethoxysilane (MTMS) (($CH_3$—O)$_3$—Si—$CH_3$), phenyltrimethoxysilane (PTMOS) ($C_6H_5$—Si—(O$CH_3$)$_3$), phenyldimethylchlorosilane (PDMCS) ($C_6H_5$—Si(Cl)—($CH_3$)$_2$), dimethylaminotrimethylsilane (DMATMS) (($CH_3$)$_2$—N—Si—($CH_3$)$_3$), bis(dimethylamino)dimethylsilane (BDMADMS), or other compounds containing Si, H, and C. The silylation agent may take the form of a gas or a vaporized liquid vapor.

The vapor phase silylation process may be conducted by placing the low-k dielectric film 100 into a processing chamber, vaporizing the silylation agent, and flowing the vaporized silylation agent into the processing chamber. The silylation agent may alternatively be vaporized in the processing chamber. The silylation agent may be introduced into the processing chamber through a showerhead positioned at an upper portion of the processing chamber. A carrier gas, such as He, Ar, $N_2$, $H_2$, and combinations thereof, may be used to assist the flow of the silylation agent into the processing chamber. Additionally, a catalyst, such as water, may be added during the vapor phase silylation process. The vapor phase silylation process may be conducted at a processing chamber pressure from about 50 mTorr to about 500 Torr, for example, from about 200 mTorr to about 6 Torr. During the silylation process, the dielectric film may be heated to a temperature from about 100° C. to about 400° C., for example, from about 200° C. to about 390° C. The flow rate of the silylation agent may be between 1 sccm and 10,000 sccm, for example, from about 100 sccm to about 2,000 sccm. The flow rate of the silylation agent may be between 400 sccm and 2,000 sccm. The flow rate of the silylation agent may be between 1 mgm and 10,000 mgm, for example, from about 100 mgm to about 2,000 mgm. The flow rate of the silylation agent may be between 1,000 mgm and 2,000 mgm. The flow rate of the optional carrier gas may be between 1 sccm and 10,000 sccm, for example, from about 2,000 sccm to about 3,000 sccm. The flow rate of the optional carrier gas may be between 400 sccm and 2,000 sccm. The processing time for the vapor phase silylation may be from about 1 minute to about 10 minutes. The pressure within the processing chamber may be varied during the vapor phase silylation process. For example, the pressure may be varied between 50 Torr and 500 Torr.

Exposing the damaged film of the low-k dielectric film to a vaporized silylation agent can replenish the damaged film with carbon and also add additional carbon to the low-k dielectric film. For example, methyl or phenyl containing silylation agents can react with the Si—OH groups in the low-k dielectric film to convert hydrophilic Si—OH groups into hydrophobic Si—O—Si bonds (e.g., Si—O—Si($CH_3$)$_3$ groups or Si—O—Si($CH_3$)$_2$—O—Si groups). As hydrophobic films are less likely to retain moisture than hydrophilic films, moisture cannot affect the properties of the treated low-k dielectric film. Therefore, the k-value of the low-k dielectric film is restored (i.e., decreased).

At block 250, the low-k dielectric film is optionally exposed to an ultraviolet cure process. The low-k dielectric film may be cured in the same processing chamber as the k-restoration process performed in block 240 using UV energy from a UV unit disposed above the UV transparent gas distribution showerhead and the UV transparent window. The UV cure process of block 250 may be performed prior to the process of block 240, simultaneously with the process of block 240, subsequent to the process of block 240, or any combinations of the aforementioned sequences. The UV cure process may be conducted by placing the low-k dielectric film 100 into a processing chamber and engaging a source of UV radiation to contact the low-k dielectric film 100 with UV radiation. The UV radiation source may be a UV lamp, for example. The UV radiation source may be positioned outside of the processing chamber, and the processing chamber may have a quartz window through which UV radiation may pass. The low-k dielectric film 100 may be positioned in an inert gas environment, such as He or Ar, for example. The processing chamber may also include a microwave source to heat the low-k dielectric film 100 prior to or concurrently with exposing the low-k dielectric film 100 with UV radiation. The UV cure process may also be conducted using plasma to simulate UV radiation wavelengths. The plasma may be formed by coupling RF power to a treatment gas such as He, Ar, $O_2$, $N_2$, or combinations thereof. The plasma may be formed by a remote plasma source (RPS) and delivered to the processing chamber.

The UV cure process may be conducted at a processing chamber pressure between 1 Torr and 100 Torr, such as 6 Torr, a dielectric film temperature between 20° C. and 400° C., such as 385° C., an environment gas flow rate between 8,000 sccm and 24,000 sccm, such as 16,000 sccm, a treatment gas flow rate between 2,000 sccm and 20,000 sccm, such as 12,000 sccm, a RF power between 50 W and 1,000 W, such as 500 W, a RF power frequency of 13.56 MHz, a processing time between 10 sec and 180 sec, such as 60 sec, a UV irradiance power between 100 W/m$^2$ and 2,000 W/m$^2$, such as 1,500 W/m$^2$, and UV wavelengths between 100 nm and 400 nm. The UV cure process described above advantageously repairs the damaged pores 103 in the sidewalls of the features 104.

In one embodiment, the UV cure temperature may be from about 100° C. to about 800° C., for example about 400° C. The UV cure time may be from about 10 seconds to about 600 seconds. A UV cure gas may be flown to the processing chamber through the UV transparent gas distribution showerhead. In one embodiment, an inert cure gas, such as helium and argon, may be flown to the processing chamber at a flow rate between about 1,000 sccm to about 27,000 sccm.

In another embodiment, the silylation process in block 240 and UV curing in block 250 can be performed simultaneously. In such a case, the UV unit turns on/off at the same time with the silylation process. In another embodiment, the UV cure in block 250 may be performed before the silylation process in block 240. In yet another embodiment, the silylation process in block 240 and the UV cure in block 250 can be performed alternately. For example, the UV cure may be performed to remove some water from surface/side wall. The silylation is then performed to recover surface hydrophobicity. The UV cure is then performed to further recover low-k film damage. In such a case, the silylation and the UV cure may be performed for about 15 to about 30 seconds, respectively. It is contemplated that the silylation agent flow rate, time, UV power, substrate temperature, chamber pressure of silylation and UV cure process may vary depending upon the application. If desired, the UV curing may be performed in a separate processing chamber different than the processing chamber for the silylation process.

Various purge gas and evacuation processes may be performed during method 200. For example, it may be advantageous to evacuate the chamber after insertion of the low-k dielectric film into the processing chamber prior to the silylation process of block 240. The processing chamber may be evacuated by use of vacuum pump.

After performance of method 200, the substrate with the low-k dielectric film disposed thereon may be removed from the processing chamber and exposed to a rinsing solvent/ solution followed by an optional drying process.

Figure 3:
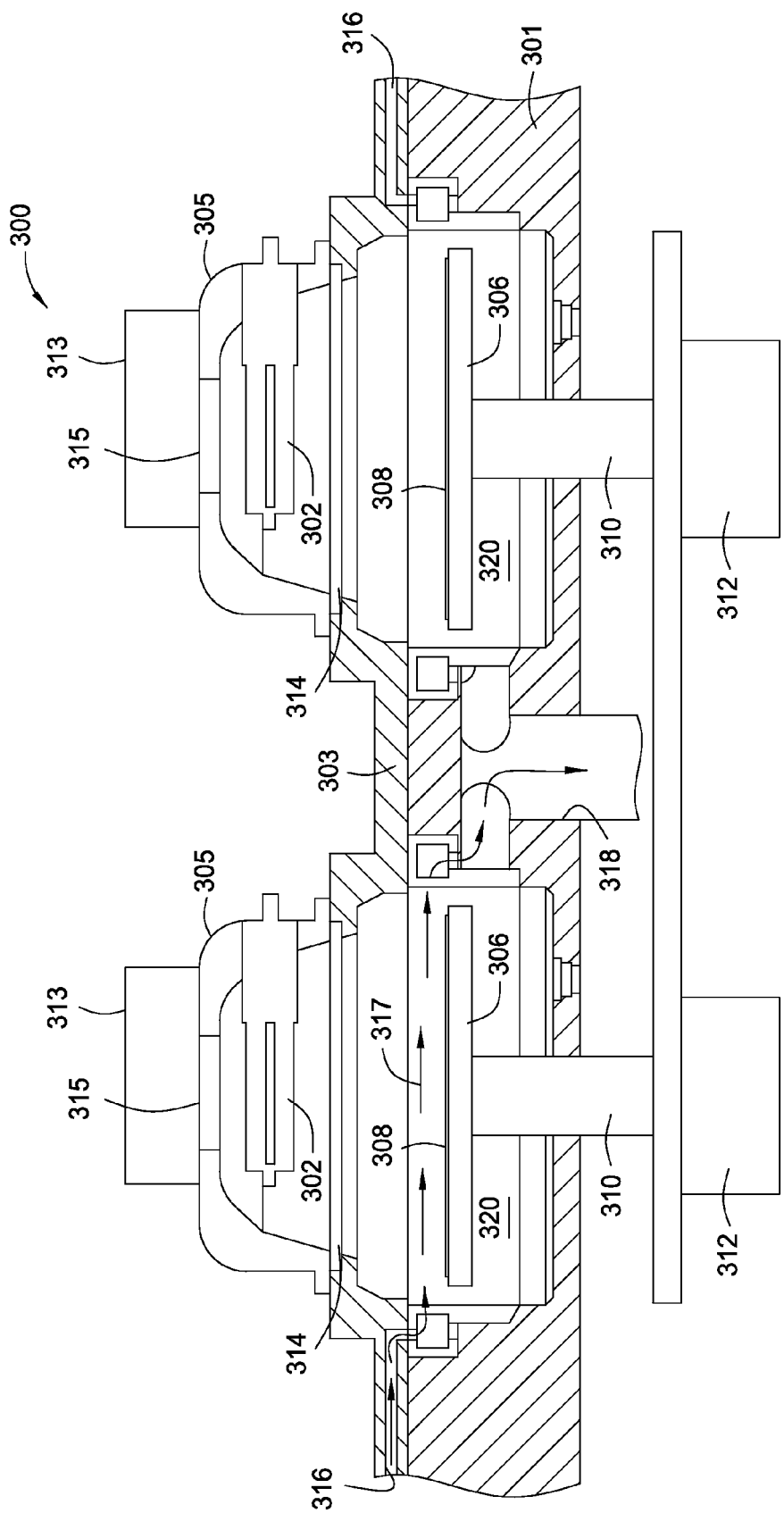
FIG. 3 is a cross-sectional view of an exemplary processing chamber that may be used to practice the embodiments described herein.

FIG. 3 is a cross-sectional view of an exemplary processing chamber that may be used to practice the embodiments described herein. FIG. 3 is based upon features of the PRODUCER® chambers currently manufactured by Applied Materials, Inc. The PRODUCER CVD chamber (200 mm or 300 mm) has two isolated processing regions that may be used to deposit carbon-doped silicon oxides and other materials.

FIG. 3 illustrates a tandem processing chamber 300 that is configured for UV curing. The tandem process chamber 300 includes a body 301 and a lid 303 that can be hinged to the body 301. Coupled to the lid 303 are two housings 305 that are each coupled to inlets along with outlets for passing cooling air through an interior of the housings 305. The cooling air can be at room temperature or approximately twenty-two degrees Celsius. A central pressurized air source (not shown) provides a sufficient flow rate of air to the inlets to insure proper operation of any UV lamp bulbs and/or power sources 313 for the bulbs associated with the tandem process chamber 300.

FIG. 3 shows a partial section view of the tandem process chamber 300 with the lid 303, the housings 305 and the power sources 313 that is configured for UV curing. Each of the housings 305 cover a respective one of two UV lamp bulbs 302 disposed respectively above two process regions 320 defined within the body 301. Each of the process regions 320 includes a heating pedestal 306 for supporting a substrate 308 within the process regions 320. The pedestals 306 can be made from ceramic or metal such as aluminum. Preferably, the pedestals 306 couple to stems 310 that extend through a bottom of the body 301 and are operated by drive systems 312 to move the pedestals 306 in the processing regions 320 toward and away from the UV lamp bulbs 302. The drive systems 312 can also rotate and/or translate the pedestals 306 during curing to further enhance uniformity of substrate illumination. Adjustable positioning of the pedestals 306 enables control of volatile cure by-product and purge and clean gas flow patterns and residence times in addition to potential fine tuning of incident UV irradiance levels on the substrate 308 depending on the nature of the light delivery system design considerations such as focal length.

In general, embodiments of the invention contemplate any UV source such as mercury microwave arc lamps, pulsed xenon flash lamps or high-efficiency UV light emitting diode arrays. The UV lamp bulbs 302 are sealed plasma bulbs filled with one or more gases such as xenon (Xe) or mercury (Hg) for excitation by the power sources 313. Preferably, the power sources 313 are microwave generators that can include one or more magnetrons (not shown) and one or more transformers (not shown) to energize filaments of the magnetrons. In one embodiment having kilowatt microwave (MW) power sources, each of the housings 305 includes an aperture 315 adjacent the power sources 313 to receive up to about 6,000 W of microwave power from the power sources 313 to subsequently generate up to about 100 W of UV light from each of the bulbs 302. In another embodiment, the UV lamp bulbs 302 can include an electrode or filament therein such that the power sources 313 represent circuitry and/or current supplies, such as direct current (DC) or pulsed DC, to the electrode.

The power sources 313 for some embodiments can include radio frequency (RF) energy sources that are capable of excitation of the gases within the UV lamp bulbs 302. The configuration of the RF excitation in the bulb can be capacitive or inductive. An inductively coupled plasma (ICP) bulb can be used to efficiently increase bulb brilliancy by generation of denser plasma than with the capacitively coupled discharge. In addition, the ICP lamp eliminates degradation in UV output due to electrode degradation resulting in a longer-life bulb for enhanced system productivity. Benefits of the power sources 313 being RF energy sources include an increase in efficiency.

Preferably, the bulbs 302 emit light across a broad band of wavelengths from 170 nm to 400 nm. The gases selected for use within the bulbs 302 can determine the wavelengths emitted. Since shorter wavelengths tend to generate ozone when oxygen is present, UV light emitted by the bulbs 302 can be tuned to predominantly generate broadband UV light above 200 nm to avoid ozone generation during cure processes.

UV light emitted from the UV lamp bulbs 302 enters the processing regions 320 by passing through windows 314 disposed in apertures in the lid 303. The windows 314 preferably are made of an OH free synthetic quartz glass and have sufficient thickness to maintain vacuum without cracking. Further, the windows 314 are preferably fused silica that transmits UV light down to approximately 150 nm. Since the lid 303 seals to the body 301 and the windows 314 are sealed to the lid 303, the processing regions 320 provide volumes capable of maintaining pressures from approximately 1 Torr to approximately 650 Torr. Processing or cleaning gases 317 enter the process regions 320 via a respective one of two inlet passages 316. The processing or cleaning gases 317 then exit the process regions 320 via a common outlet port 318. Additionally, the cooling air supplied to the interior of the housings 305 circulates past the bulbs 302, but is isolated from the process regions 320 by the windows 314.

EXAMPLES

Objects and advantages of the embodiments described herein are further illustrated by the following examples. The particular materials and amounts thereof, as well as other conditions and details, recited in these examples should not be used to limit the embodiments described herein.

For sample 1 and sample 2 the wafers were transferred between processing chambers without breaking vacuum. For the repair process performed in sample 1 and sample 2 there were two process steps. For the first process UV was not applied. UV was applied during the second process. Although samples 1 and 2 were performed in separate chambers a single chamber may be used with simultaneous chemical and UV exposure.

Sample 1:

A Black Diamond II™ low-k dielectric film was dipped in an etchant solution (1:100 hydrofluoric acid:water) for one minute to induce damage within the low-k dielectric film. The damaged low-k dielectric film was rinsed with DI water to remove excess hydrofluoric acid and dried. The damaged low-k dielectric film was positioned in a PRODUCER CVD processing chamber. The low-k dielectric film was heated to about 385° C. The pressure in the processing chamber was adjusted to about 6 Torr. Dimethylaminotrimethylsilane (DMATMS) along with a helium carrier gas was flown into the processing chamber. The flow rate of the DMATMS and the helium carrier gas was about 1,000 mgm and 2,000 sccm respectively. The processing time for the vapor phase silylation was about three minutes.

After the silylation process, the low-k dielectric film was transferred to a second processing chamber for UV exposure. The low-k dielectric film was heated to about 385° C. The pressure in the processing chamber was adjusted to about 6 Torr. Helium gas and argon gas were flown into the processing chamber. The flow rate of helium gas and argon gas was about 16,000 sccm and about 16,000 sccm respectively. The UV exposure time was about 30 seconds with about 95% of UV output and UV wavelengths between 100 nm and 400 nm.

Sample 2:

A Black Diamond II™ low-k dielectric film was dipped in etchant solution (1:100 hydrofluoric acid:water or diluted HF "DHF") for five minutes to induce damage within the low-k dielectric film. The damaged low-k dielectric film was rinsed with DI water to remove excess hydrofluoric acid and dried. The damaged low-k dielectric film was positioned in a PRODUCER CVD processing chamber. The low-k dielectric film was heated to about 385° C. The pressure in the processing chamber was adjusted to about 6 Torr. Dimethylaminotrimethylsilane (DMATMS) along with a helium carrier gas was flown into the processing chamber. The flow rate of the DMATMS and the helium carrier gas was about 1,000 mgm and 2,000 sccm respectively. The processing time for the vapor phase silylation was about three minutes.

After the silylation process, the low-k dielectric film was transferred to a second processing chamber for UV exposure. The low-k dielectric film was heated to about 385° C. The pressure in the processing chamber was adjusted to about 6 Torr. Helium gas and argon gas were flown into the processing chamber. The flow rate of helium gas and argon gas was about 16,000 sccm and about 16,000 sccm respectively. The UV exposure time was about 30 seconds with about 95% of UV output and UV wavelengths between 100 nm and 400 nm.

Sample 3:

A Black Diamond II™ low-k dielectric film was dipped in etchant solution (1:100 hydrofluoric acid:water or diluted HF "DHF") for ten minutes to induce damage within the low-k dielectric film. The damaged low-k dielectric film was rinsed with DI water to remove excess hydrofluoric acid and dried. The damaged low-k dielectric film was positioned in a PRODUCER CVD processing chamber. The low-k dielectric film was heated to about 385° C. The pressure in the processing chamber was adjusted to about 6 Torr. Dimethylaminotrimethylsilane (DMATMS) along with a helium carrier gas was flown into the processing chamber. The flow rate of the DMATMS and the helium carrier gas was about 1,000 mgm and 2,000 sccm respectively. The processing time for the vapor phase silylation was about three minutes.

Sample 3 was not exposed to UV since the film was destroyed during exposure to the etchant solution.

Results:

TABLE 1

| Sample | Etch Time (min.) | Before HF | | | After HF | | | After Repair | | |
|---|---|---|---|---|---|---|---|---|---|---|
| | | Thick. | RI | k-avg. | Thick. | RI | k-avg. | Thick. | RI | k-avg. |
| 1 | 1 | 1,972 | 1.3437 | 2.54 | 1,971 | 1.3456 | 2.61 | 1907 | 1.3596 | 2.41 |
| 2 | 5 | 1,992 | 1.3427 | 2.54 | 2084 | 1.3050 | 2.87 | 1870 | 1.3586 | 2.24 |
| 3 | 10 | 1,990 | 1.3430 | 2.54 | 20 | 1.1079 | n/a | | | |

As depicted in Table 1, Sample 2 (5-minute DHF exposure) had a higher k-value than Sample 1 (1-minute DHF exposure) after HF exposure. Thus the DHF exposure time trended with post-DHF k-value. Not to be bound by theory but it is believed that increased exposure time of Sample 2 to DHF yielded more damage (e.g., Si—OH). Due to the increased damage in Sample 2, Sample 2 had a lower k after silylation.

Single beam measurements of the films post-damage and post-repair were performed. Subtraction of one single-beam spectrum from the other yields a difference spectrum that shows intensity gains and losses at various wavenumbers. A comparison of FTIR difference spectra (repaired minus damaged) demonstrated that Sample 2 had a larger increase in carbon and Si—O—Si and a larger decrease in Si—OH during silylation. All of these outcomes are results of having more SiOH after DHF exposure (SiOH+DMATMS→Si—O—Si-Me$_3$+DMA). FTIR analysis is a measure of the number of reactions and the presence of more Si—OH indicates more reactions. Dimethylamine (DMA) is a by-product of the reaction of DMATMS with Si—OH.

Using certain embodiments described herein, the dielectric constant of a low-k dielectric film was reduced from low-k dielectric film having a k of 2.54 into a low-k dielectric film having a k of 2.24. In order to reduce the dielectric constant of a low-k film, we have to damage to larger extent (the intermediate k-value between DHF exposure and exposure to the silylation agent has to be higher). The DHF process therefore controls the outcome. However, if the DHF exposure time is too long, the low-k dielectric film may be destroyed as shown by Sample 3 which was exposed for a time period of ten minutes. In addition to time, other factors such as temperature and concentration will dictate if the process is viable and how low the dielectric constant of the final film is.

While the foregoing is directed to embodiments of the present invention, other and further embodiments of the invention may be devised without departing from the basic scope thereof, and the scope thereof is determined by the claims that follow.

The invention claimed is:

1. A method for lowering a dielectric constant (k) of a low-k silicon-containing dielectric film, comprising:
   exposing a low-k silicon-containing dielectric film to a hydrofluoric acid solution;
   exposing the low-k silicon-containing dielectric film to a vaporized silylation agent; and
   exposing the low-k silicon-containing dielectric film to an ultraviolet (UV) cure process.

2. The method of claim 1, wherein the exposing a low-k silicon-containing dielectric film to a vaporized silylation agent and the exposing a low-k silicon-containing dielectric film to an ultraviolet cure process are performed in the same processing chamber.

3. The method of claim 1, wherein the UV cure process is performed at a UV cure temperature from about 100 degrees Celsius to about 800 degrees Celsius.

4. The method of claim 3, further comprising using a plasma to simulate UV radiation wavelengths.

5. The method of claim 4, wherein the plasma is formed by a remote plasma source.

6. The method of claim 1, wherein the exposing the low-k silicon-containing dielectric film to a vaporized silylation agent and the exposing the low-k silicon-containing dielectric film to a UV cure process are performed simultaneously.

7. The method of claim 1, further comprising:
   repeating the exposing the low-k silicon-containing dielectric film to a vaporized silylation agent and the exposing the low-k silicon-containing dielectric film to a UV cure process.

8. The method of claim 1, wherein the low-k silicon-containing dielectric film has a lower dielectric constant (k) after exposure to the silylation agent as compared to the dielectric constant (k) of the low-k silicon containing dielectric prior to exposure to the hydrofluoric acid solution.

9. The method of claim 1, wherein the low-k silicon-containing dielectric film is a silicon based dielectric material having an initial dielectric constant of three or less.

10. The method of claim 9, wherein the low-k silicon-containing dielectric film is a silicon oxide containing carbon and hydrogen.

11. The method of claim 1, wherein the low-k silicon-containing dielectric film is exposed to an integration process selected from a planarization process, an etching process, a diffusion barrier deposition process, a metal deposition process, or combinations thereof prior to the exposing the low-k silicon-containing dielectric film to a hydrofluoric acid solution.

12. The method of claim 1, wherein the exposing the low-k silicon-containing dielectric film to an ultraviolet cure process is performed prior to the exposing the low-k silicon-containing dielectric film to a silylation agent, simultaneously with the exposing the low-k silicon-containing dielectric film to a silylation agent, subsequent to the exposing the low-k silicon-containing dielectric film to a silylation agent, or combinations thereof.

13. The method of claim 12, wherein the exposing the low-k silicon-containing dielectric film to an ultraviolet cure process is performed subsequent to exposing the low-k silicon-containing dielectric film to a silylation agent.

14. The method of claim 1, wherein the exposing the low-k silicon-containing dielectric film comprises dipping the low-k silicon containing dielectric film into the hydrofluoric acid solution or spraying the hydrofluoric acid solution onto the low-k silicon-containing dielectric film.

15. The method of claim 1, further comprising heating the low-k silicon-containing dielectric film prior to or concurrently with the exposing the low-k silicon-containing dielectric film to the ultraviolet cure process.

16. The method of claim 1, wherein the low-k silicon-containing dielectric film has nanopores formed therein that have a diameter in the range of 0.5 nanometers to 20 nanometers.

17. The method of claim 1, wherein the silylation agent is in vapor phase and is selected from the group consisting of hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS), dimethyldimethoxysilane (DMDMS), methyltrimethoxysilane (MTMS), phenyltrimethoxysilane (PTMOS), phenyldimethylchlorosilane (PDMCS), dimethylaminotrimethylsilane (DMATMS), bis(dimethylamino)dimethylsilane (BDMADMS), and combinations thereof.

18. The method of claim 17, wherein the silylation agent is DMATMS.

19. A method for lowering a dielectric constant (k) of a low-k silicon-containing dielectric film, comprising:
forming features in a low-k silicon-containing dielectric film;
depositing a metal material into the features of the low-k silicon-containing dielectric film;
planarizing the metal material;
exposing the low-k silicon-containing dielectric film to a hydrofluoric acid solution;
exposing the low-k silicon-containing dielectric film to a vaporized silylation agent; and
exposing the low-k silicon-containing dielectric film to an ultraviolet (UV) cure process.

20. The method of claim 19, further comprising removing oxides from the metal material that form during planarizing the metal material by treating the low-k silicon-containing dielectric film with a hydrogen or ammonia plasma.

* * * * *